US010511285B1

United States Patent
Patil

(10) Patent No.: US 10,511,285 B1
(45) Date of Patent: Dec. 17, 2019

(54) ANCHORED POLYMERIC PACKAGE FOR ACOUSTIC RESONATOR STRUCTURES

(71) Applicant: Avago Technologies International Sales Pte. Limited, Singapore (SG)

(72) Inventor: Vikram Patil, Fort Collins, CO (US)

(73) Assignee: Avago Technologies International Sales Pte. Limited (SG)

( * ) Notice: Subject to any disclaimer, the term of this patent is extended or adjusted under 35 U.S.C. 154(b) by 0 days.

(21) Appl. No.: 15/720,273

(22) Filed: Sep. 29, 2017

Related U.S. Application Data

(63) Continuation-in-part of application No. 15/445,643, filed on Feb. 28, 2017.

(51) Int. Cl.
*H03H 9/15* (2006.01)
*H03H 9/54* (2006.01)
*H03H 9/17* (2006.01)
*H03H 9/25* (2006.01)

(52) U.S. Cl.
CPC .............. *H03H 9/171* (2013.01); *H03H 9/25* (2013.01)

(58) Field of Classification Search
CPC .................................. H03H 9/15; H03H 9/54
USPC .................................................. 333/187, 189
See application file for complete search history.

(56) References Cited

U.S. PATENT DOCUMENTS

| | | | |
|---|---|---|---|
| 5,587,620 A | 12/1996 | Ruby et al. | |
| 5,873,153 A | 2/1999 | Ruby et al. | |
| 6,107,721 A | 8/2000 | Lakin | |
| 6,507,983 B1 | 1/2003 | Ruby et al. | |
| 6,828,713 B2 | 12/2004 | Bradley et al. | |
| 6,955,950 B2 | 10/2005 | Aigner et al. | |
| 7,280,007 B2 | 10/2007 | Feng et al. | |
| 7,300,823 B2 | 11/2007 | Franosch et al. | |
| 7,345,410 B2 | 3/2008 | Grannen et al. | |
| 7,358,831 B2 | 4/2008 | Larson, III et al. | |
| 7,369,013 B2 | 5/2008 | Fazzio et al. | |
| 7,388,454 B2 | 6/2008 | Ruby et al. | |
| 7,561,009 B2 | 7/2009 | Larson, III et al. | |
| 7,629,865 B2 | 12/2009 | Ruby et al. | |
| 7,646,035 B2 * | 1/2010 | Loh ..................... | B29C 45/1671 257/100 |
| 7,692,317 B2 | 4/2010 | Franosch et al. | |
| 7,714,684 B2 | 5/2010 | Ruby et al. | |
| 7,791,434 B2 | 9/2010 | Fazzio et al. | |
| 8,188,810 B2 | 5/2012 | Fazzio et al. | |
| 8,230,562 B2 | 7/2012 | Fazzio et al. | |
| 8,248,185 B2 | 8/2012 | Choy et al. | |
| 8,269,291 B2 * | 9/2012 | Buchwalter .......... | B81C 1/0023 257/254 |

(Continued)

OTHER PUBLICATIONS

Co-pending U.S. Appl. No. 15/445,643, filed Feb. 28, 2017.
Co-pending U.S. Appl. No. 15/639,124, filed Jun. 30, 2017.
Co-pending U.S. Appl. No. 15/661,468, filed Jun. 27, 2017.

*Primary Examiner* — Dean O Takaoka
(74) *Attorney, Agent, or Firm* — Sheridan Ross P.C.

(57) ABSTRACT

An apparatus comprises a device substrate having an upper surface. An anchor opening exists in the device substrate. The apparatus also comprises a lid layer disposed over the upper surface of a frame layer. The lid layer and the frame layer each comprise a photodefinable polymer material. The apparatus also comprises a compartment in the frame layer. The lid layer provides a cover for the compartment, and a portion of the frame layer is disposed in the anchor opening.

21 Claims, 12 Drawing Sheets

(56) References Cited

U.S. PATENT DOCUMENTS

| | | |
|---|---|---|
| 8,436,516 B2 | 5/2013 | Ruby et al. |
| 8,669,572 B2 * | 3/2014 | Leung .................. H01L 33/486 |
| | | 257/98 |
| 8,673,121 B2 | 3/2014 | Larson, III et al. |
| 8,902,023 B2 | 12/2014 | Choy et al. |
| 8,981,876 B2 | 3/2015 | Jamneala et al. |
| 9,136,819 B2 | 9/2015 | Grannen et al. |
| 9,197,185 B2 | 11/2015 | Zou et al. |
| 9,243,316 B2 | 1/2016 | Larson, III et al. |
| 9,450,167 B2 | 9/2016 | Zou et al. |
| 9,455,681 B2 | 9/2016 | Feng et al. |
| 9,479,139 B2 | 10/2016 | Ruby et al. |
| 9,484,882 B2 | 11/2016 | Burak et al. |
| 9,590,165 B2 | 3/2017 | Zou et al. |
| 9,602,073 B2 | 3/2017 | Grannen et al. |
| 9,679,765 B2 | 6/2017 | Larson, III et al. |
| 2006/0096945 A1 | 5/2006 | Shen |
| 2009/0096321 A1 | 4/2009 | Aikawa et al. |
| 2012/0274183 A1 * | 11/2012 | Sinha ................ H03H 9/02086 |
| | | 310/340 |
| 2012/0326807 A1 | 12/2012 | Choy et al. |
| 2013/0015747 A1 | 1/2013 | Ruby et al. |
| 2017/0063329 A1 | 3/2017 | Gilbert et al. |
| 2017/0063331 A1 | 3/2017 | Gilbert et al. |
| 2017/0063333 A1 | 3/2017 | Gilbert et al. |
| 2017/0063339 A1 | 3/2017 | Burak et al. |
| 2018/0183406 A1 * | 6/2018 | Patil ........................ H03H 3/02 |

* cited by examiner

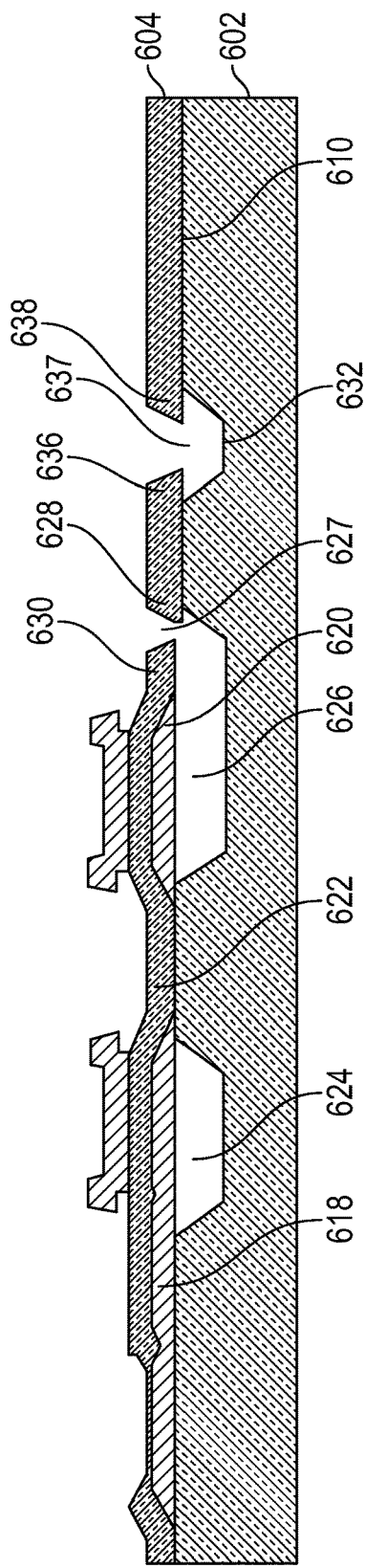
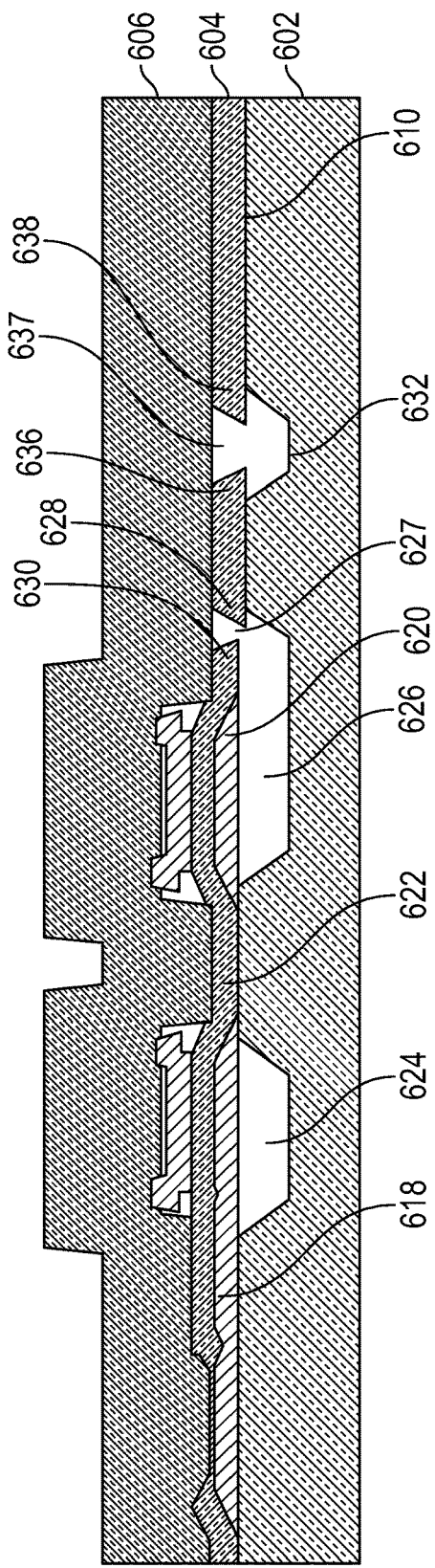
FIG. 6A
FIG. 6B

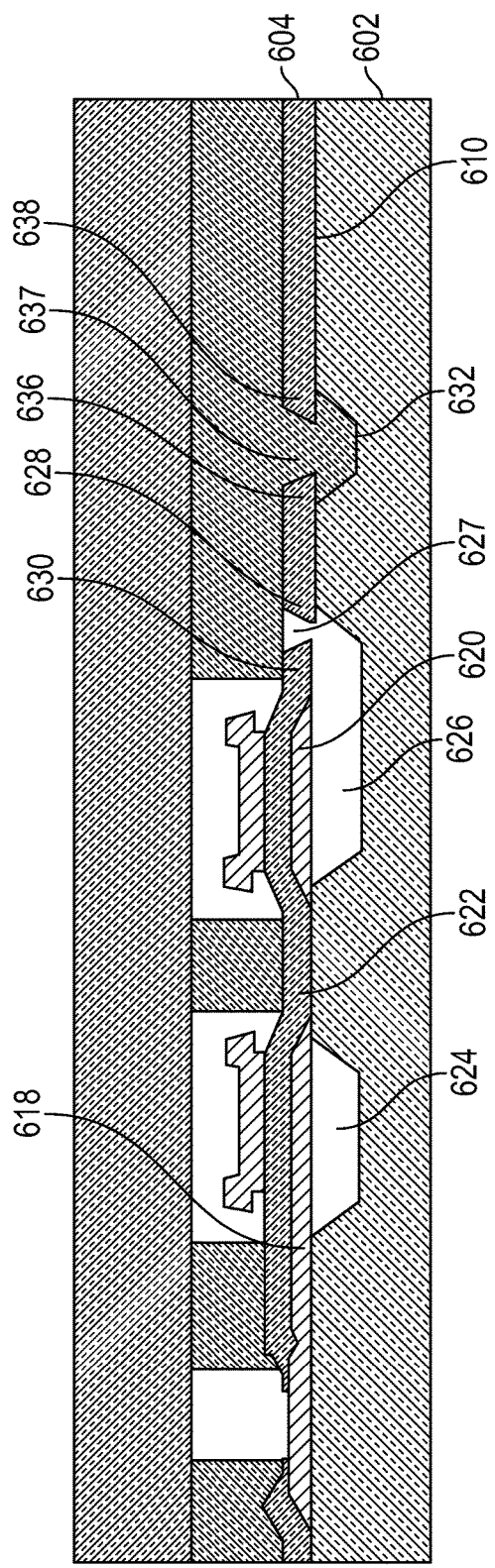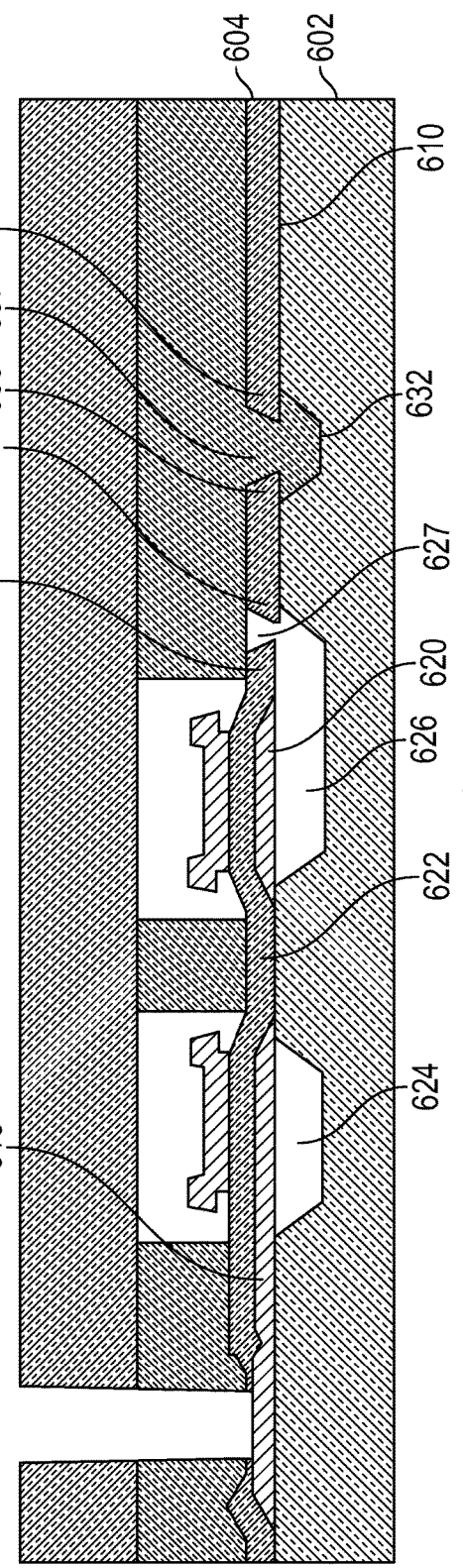
FIG. 6H
FIG. 6I

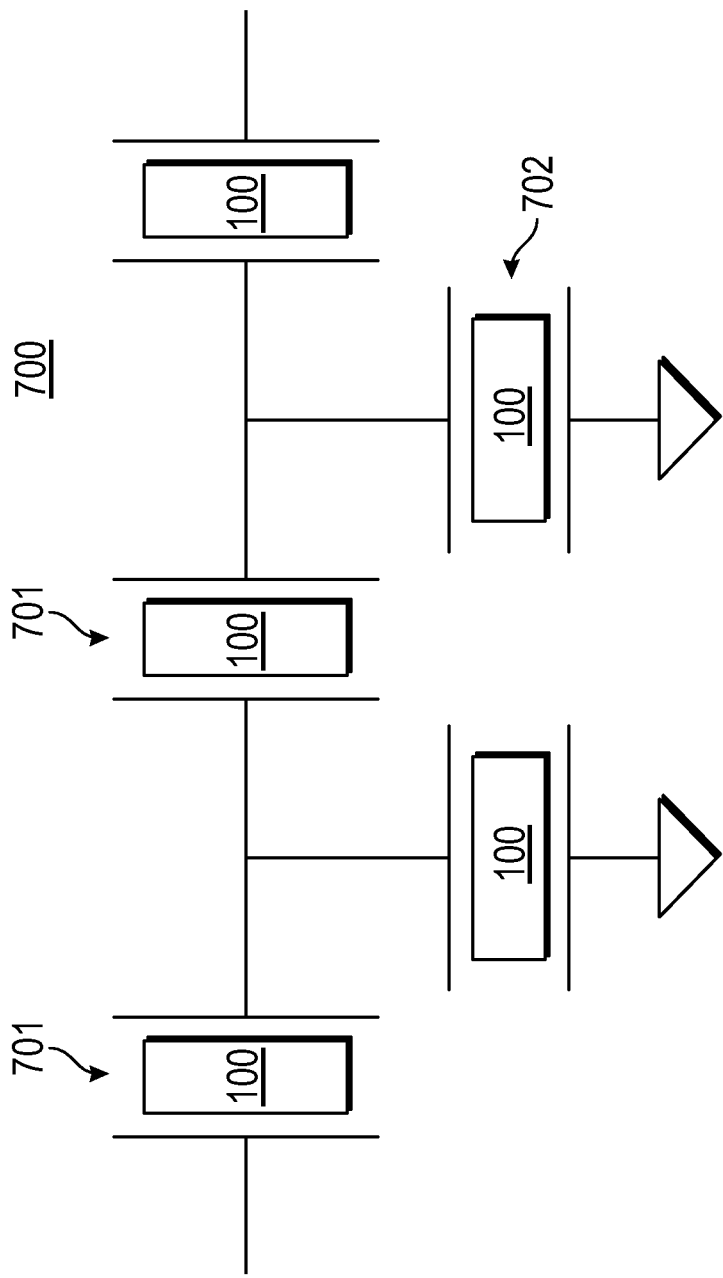

ANCHORED POLYMERIC PACKAGE FOR ACOUSTIC RESONATOR STRUCTURES

CROSS-REFERENCE TO RELATED APPLICATIONS

The present application is a continuation-in-part application under 37 C.F.R. § 1.53(b) of commonly owned U.S. patent application Ser. No. 15/445,643, entitled "Packaged Resonator with Polymeric Air Cavity Package," to V. Patil, et al., and filed on Feb. 28, 2017. The entire disclosure of U.S. patent application Ser. No. 15/445,643 is specifically incorporated herein by reference.

BACKGROUND

Electrical resonators are widely incorporated in modern electronic devices. For example, in wireless communications devices, radio frequency (RF) and microwave frequency resonators are used in filters, such as filters having electrically connected series and shunt resonators forming ladder and lattice structures. The filters may be included in a multiplexer, such as a duplexer, for example, connected between an antenna (or multiple antennas as in the case of multiple input, multiple output (MIMO) designs) and a transceiver for filtering received and transmitted signals, typically within a predetermined radio frequency band. Other types of multiplexers in which the filters may be included are diplexers, triplexers, quadplexers, quintplexers and the like, for example. The multiplexer interfaces between the antenna and each of various networks to enable transmitting signals on different transmit (uplink) frequencies and receiving signals on different receive (downlink) frequencies. The filters associated with the multiplexer typically include band pass filters, which provide passbands for passing various transmitted and received signals through relatively narrow frequency bands (blocking all signals with frequencies outside the passbands).

As will be appreciated, it is desirable to reduce the size of components of electronic devices. Many known filter technologies present a barrier to overall system miniaturization. With the need to reduce component size, a class of resonators based on the piezoelectric effect has emerged. In piezoelectric-based resonators, acoustic resonant modes are generated in the piezoelectric material. These acoustic waves are converted into electrical waves for use in electrical applications.

One type of piezoelectric resonator is a Bulk Acoustic Wave (BAW) resonator. The BAW resonator has the advantage of small size and lends itself to Integrated Circuit (IC) manufacturing tools and techniques. The BAW includes an acoustic stack. The acoustic stack includes, inter alia, a layer of piezoelectric material disposed between two electrodes. Acoustic waves achieve resonance across the acoustic stack, with the resonant frequency of the waves being determined by the materials in the acoustic stack.

Film bulk acoustic resonator (FBAR) filters are one type of BAW filters. FBAR technology is characterized by superior performance in terms of Q over frequency, effective coupling coefficient kt2, and precise frequency control. These FBAR performance characteristics translate to superior product performance in terms of (low) insertion loss, (satisfactory) roll off characteristics at filter edge, (optimum) isolation, and (highest) nonlinearity performance.

FBARs include a piezoelectric layer sandwiched between two metal electrodes, i.e., a top metal electrode and a bottom metal electrode. FBARs are placed above an air cavity, and rely on air cavity packaging technology to achieve required performance characteristics. As a result, air cavities below FBARs must necessarily be robust and must not interfere with the resonator frequency centering, Q values, or nonlinearities.

Known packaging for FBAR(s) may include a semiconductor microcap lid placed over the FBAR(s) and the above-noted air cavities formed below the FBAR(s). The microcap lid may be held above the FBAR(s) by posts that are formed from the same material as the microcap lid and that are integral with the microcap lid wafer. The microcap lids are a wafer-level silicon cap (microcap) micromachined from a high resistivity wafer.

Parasitic contributions from the microcap lid wafer/microcap lid degrade linear performance characteristics of the packaged FBAR product. The parasitic contributions arise from the bulk conductivity of the semiconductor (e.g., silicon material) used for the microcap lid, as well as surface capacitances and inversions, plus the charging and discharging of semiconductor trap states. Any solution to the parasitic contributions that provides high performance at a lower cost should not interfere with the air cavities below the FBAR, nor adversely affect the frequency centering, Q values, or nonlinearities.

Additionally, gold thermocompression bonds may be used to hold the posts to the substrate that includes the air cavity below the FBAR. The posts are aligned with the gold thermocompression bonds to affix the microcap lid wafer over the FBAR device wafer. The gold thermocompression bond is expensive. At least in part to due to this expense, the size of the area in which the posts are attached to the substrate is limited, and the gold thermocompression bond is used only around a perimeter of the posts. Additionally, the gold thermocompression bond is used at high-pressure/high-temperature which poses a potential obstacle to scaling FBARs to wafers larger than, for example, 200 millimeters. Moreover, the gold thermocompression bonds are IR-based rather than lithography based What is needed are package structures that overcome at least the shortcomings of known package structures described above.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals, refer to like elements.

FIGS. 6A-6J are cross-sectional views of a process for fabricating an apparatus according to a representative embodiment.

FIG. 7 is a simplified schematic block diagram of an acoustic filter in accordance with a representative embodiment.

DETAILED DESCRIPTION

Figure 1:
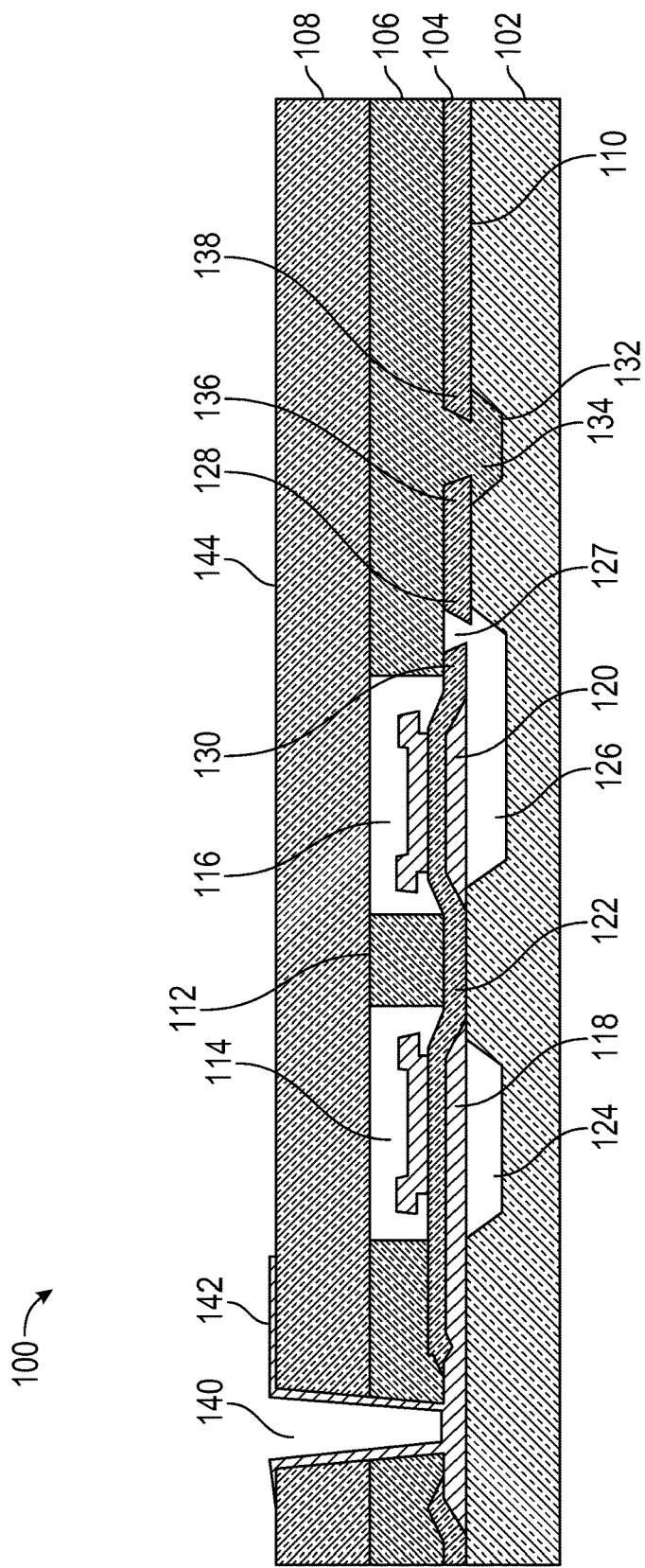
FIG. 1 is a cross-sectional view of an apparatus according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

It is to be understood that the terminology used herein is for purposes of describing particular embodiments only, and is not intended to be limiting. Any defined terms are in addition to the technical and scientific meanings of the defined terms as commonly understood and accepted in the technical field of the present teachings.

As used in the specification and appended claims, the terms 'a', 'an' and 'the' include both singular and plural referents, unless the context clearly dictates otherwise. Thus, for example, 'a device' includes one device and plural devices.

As used in the specification and appended claims, and in addition to their ordinary meanings, the terms 'substantial' or 'substantially' mean to with acceptable limits or degree. For example, 'substantially cancelled' means that one skilled in the art would consider the cancellation to be acceptable.

As used in the specification and the appended claims and in addition to its ordinary meaning, the term 'approximately' means to within an acceptable limit or amount to one having ordinary skill in the art. For example, 'approximately the same' means that one of ordinary skill in the art would consider the items being compared to be the same.

Relative terms, such as "above," "below," "top," "bottom," "upper" and "lower" may be used to describe the various elements' relationships to one another, as illustrated in the accompanying drawings. These relative terms are intended to encompass different orientations of the device and/or elements in addition to the orientation depicted in the drawings. For example, if the device were inverted with respect to the view in the drawings, an element described as "above" another element, for example, would now be "below" that element. Similarly, if the device were rotated by 90° with respect to the view in the drawings, an element described "above" or "below" another element would now be "adjacent" to the other element; where "adjacent" means either abutting the other element, or having one or more layers, materials, structures, etc., between the elements.

In accordance with a representative embodiment, an apparatus comprises: a device substrate having an upper surface. An anchor opening exists in the device substrate; a frame layer having an upper surface. The apparatus also comprises a lid layer disposed over the upper surface of the frame layer. The lid layer and the frame layer each comprise a photodefinable polymer material. The apparatus also comprises a compartment in the frame layer. The lid layer provides a cover for the compartment, and a portion of the frame layer is disposed in the anchor opening.

In accordance with another representative embodiment, an electrical filter comprises a device substrate having an upper surface. An anchor opening exists in the device substrate. The electrical filter also comprises: a frame layer having an upper surface; and a lid layer disposed over the upper surface of the frame layer. The lid layer and the frame layer each comprise a photodefinable polymer material. The electrical filter also comprises a compartment in the frame layer. The lid layer provides a cover for the compartment, and a portion of the frame layer is disposed in the anchor opening. The electrical filter also comprises an acoustic resonator disposed in the compartment in the frame layer, and above the upper surface of the device substrate.

FIG. 1 is a cross-sectional view of an apparatus 100 according to a representative embodiment. The apparatus 100 may also be a component of a wafer-level package for reasons that will become clearer as the present description continues.

The apparatus 100 comprises a device substrate 102, and a piezoelectric layer 104 disposed thereover. A frame layer 106 is disposed over an upper surface 110 of the device substrate 102, and comprises a photo-definable polymer material, the use and benefits thereof being described more fully below.

A lid layer 108 is disposed over an upper surface 112 of the frame layer 106, and generally comprises the same material as the frame layer 106. As described more fully below, the frame layer 106 and the lid layer 108 are separate layers when applied during fabrication of the apparatus. However, after processing the apparatus, such as during curing, the interface between the frame layer 106 and the lid layer 108 may be difficult, if not impossible to discern. As such, while the frame layer 106 and the lid layer 108 are initially separate layers, in the finished apparatus, these two layers are essentially one layer.

A first compartment 114 and a second compartment 116 are formed in the frame layer 106, and the lid layer 108 provides a cover for the first compartment 114. It is noted that the inclusion of two compartments in the apparatus 100 is merely illustrative, and more or fewer compartments, covered by the lid layer 108, are contemplated. Beneficially, the first compartment 114, which is formed by frame layer 106 and lid layer 108, is substantially hermetically sealed, thereby preventing an appreciable degree of contaminants from entering the first compartment 114. Generally, the first and second compartments 114, 116 provide sufficient hermeticity to prevent subsequently deposited mold compound (not shown) from entering the first and second compartments 114,116. The frame layer 106 and lid layer 108, which provide the first and second compartments 114, 116, may also provide a degree of hermeticity to moisture, such as to meet a Joint Electron Device Engineering Council (JEDEC) specification requirement.

A first acoustic resonator 118 and a second acoustic resonator 120 are disposed over an upper surface 110 of the device substrate 102. In the present representative embodiment, the first acoustic resonator 118 is disposed over a first air cavity 124 in the device substrate 102, and the second acoustic resonator 120 is disposed over a second air cavity 126 in the device substrate 102. As will appreciated by one of ordinary skill in the art, the first and second acoustic resonators 118, 120 are film bulk acoustic wave resonators (FBARs) each having an active area comprised of the contacting overlap of a first electrode, piezoelectric layer 104, and a second electrode, disposed over respective first and second air cavities 124, 126. Alternatively, rather than air cavities, the first and second acoustic resonators 118, 120 may be disposed over a structure of alternating low acoustic impedance and high acoustic impedance layers (not shown) for acoustic isolation. This structure of alternating low and high acoustic impedance layers is often referred to as a Bragg mirror.

A variety of devices, structures thereof, materials and methods of fabrication are contemplated for the first and second acoustic resonators 118, 120 of the apparatus 100. Various details of such FBAR and SMR devices contemplated for use as the first and second acoustic resonators 118, 120 of the apparatus 100, and corresponding methods of fabrication may be found, for example, in one or more of the following U.S. patent documents: U.S. Pat. No. 6,107,721, to Lakin; U.S. Pat. Nos. 5,587,620, 5,873,153, 6,507,983, 7,388,454, 7,629,865, 7,714,684, and 8,436,516 to Ruby et al.; U.S. Pat. Nos. 7,369,013, 7,791,434, 8,188,810, and 8,230,562 to Fazzio, et al.; U.S. Pat. No. 7,280,007 to Feng et al.; U.S. Pat. Nos. 8,248,185, and 8,902,023 to Choy, et al.; U.S. Pat. No. 7,345,410 to Grannen, et al.; U.S. Pat. No. 6,828,713 to Bradley, et al.; U.S. Pat. Nos. 7,561,009 and 7,358,831 to Larson, III et al.; U.S. Pat. No. 9,197,185 to Zou, et al.; U.S. Patent Application Publication No. 20120326807 to Choy, et al.; U.S. Pat. Nos. 9,243,316 and 8,673,121 to Larson III, et al.; U.S. Pat. No. 8,981,876 to Jamneala et al.; U.S. Pat. No. 9,479,139 to Ruby, et al.; U.S. Patent Application Publication No. 20130015747 to Ruby, et al.; U.S. Pat. No. 9,197,185 to Zou, et al.; U.S. Pat. No. 9,484,882 to Burak, et al.; U.S. Pat. No. 9,679,765 to John L. Larson III; U.S. Pat. Nos. 9,136,819 and 9,602,073 to Grannen, et al.; U.S. Pat. Nos. 9,450,167, and 9,590,165 to Zou, et al.; U.S. Pat. No. 9,455,681 to Feng, et al; and U.S. patent application Ser. No. 15/661,468 to Ruby, et al., and filed on Jun. 27, 2017. The entire disclosure of each of the patents, patent application publications, and patent application listed above are hereby specifically incorporated by reference herein. It is emphasized that the components, materials and methods of fabrication described in these patents and patent applications are representative, and other methods of fabrication and materials within the purview of one of ordinary skill in the art are also contemplated.

In certain representative embodiments the first and second acoustic resonators 118, 120 are surface acoustic wave (SAW) resonators, such as described in commonly-owned U.S. Patent Application and Patent Application Publications: U.S. patent application Ser. No. 15/639,124 filed on Jun. 30, 2017, naming Stephen Roy Gilbert et al. as inventors; U.S. Patent Application Publication No. 20170063331 to Gilbert, et al.; U.S. Patent Application Publication No. 20170063333 to Gilbert et al.; and U.S. Patent Application Publication No. 20170063329 to Gilbert, et al. The entire disclosures of U.S. patent application Ser. No. 15/639,124; and U.S. Patent Application Publication Nos. 20170063331, 20170063333 and 20170063329 are specifically incorporated herein by reference.

A release opening 127 is provided in the device substrate 102 as shown. As is known, the release opening 127 is provided adjacent to the second air cavity 126, and enables the selective removal of sacrificial material (not shown) disposed in the second air cavity 126. A similar release opening (not shown) is provided to enable removal of sacrificial material (not shown) in the first air cavity 124. It is emphasized that the present teachings contemplate embodiments in which no release opening is required, and as such, is not provided. But rather, as will be readily appreciated by one of ordinary skill in the art, the release opening 127 is provided only in embodiments that include an FBAR device. Accordingly, in embodiments in which the first and second acoustic resonators 118, 120 are SMR devices, or SAW devices, or other electronic devices, no release opening is provided, and no adhesion from filling such a release opening is realized.

In a representative embodiment, a first portion 128 of the piezoelectric layer 104 overhangs an edge of the first air cavity 124, and a second portion 130 of the piezoelectric layer 104, which opposes the first portion 128, overhangs an edge of the second air cavity 126. In the presently described embodiment, the first and second portions 128, 130 of the piezoelectric layer 104 provide the release opening 127. As described more fully below, in a representative embodiment, a portion of the frame layer 106 is disposed in the release opening 127, but does not extend into the second air cavity 126. It is noted that, according to a representative embodiment, the release opening 127 is an opening (i.e., a hole) in the piezoelectric layer 104, and in such an embodiment, the first and second portions 128, 130 are merely opposing sides of the hole that is the release opening 127. Alternative geometric arrangements are contemplated for the release opening 127, and dictate the shape of the first and second portions 128, 130.

Beneficially, providing this material in the release opening 127 increases the contacting surface area between the upper surface of the device substrate 102 and the lower surface of the frame layer 106. This increase in surface area improves adherence of the frame layer 106 to the device substrate 102, and results in a more robust apparatus 100. Finally, it is noted that the use of the piezoelectric layer 104 to form the release opening 127 is merely illustrative. More generally, a layer (not shown) of another material of the apparatus (e.g., another layer of the first and/or second acoustic resonators 118, 120), or a dedicated layer (not shown) may be provided.

An anchor opening 132 is provided in the device substrate 102. Generally, and as described more fully below, the anchor opening 132 is disposed to circumscribe the various components (e.g., first and second acoustic resonators 118, 120) of a chip that is packaged for singulation. Accordingly, the apparatus 100 may be a component of a wafer-level package of a filter, or a multiplexer, or other similar single-chip components.

The anchor opening 132 has a portion 134 of the frame layer 106 disposed therein. In a representative embodiment, a third portion 136 (sometimes referred to as the first portion) of the piezoelectric layer 104 overhangs an edge of the anchor opening 132, and a fourth portion 138 (sometimes referred to as the second portion) of the piezoelectric layer 104, opposing the third portion 136, overhangs the anchor opening 132.

Beneficially, portion 134 of the frame layer 106 increases the surface area of contact between the upper surface of the device substrate 102 and the lower surface of the frame layer 106. This increase in surface area improves adherence of the frame layer 106 to the device substrate 102, and results in a more robust apparatus 100. Furthermore, the overhang of the third and fourth portions 136, 138 on top of the portion 134 of the frame layer 106 in the anchor opening 132 reinforces the adhesion of the device substrate 102 to the frame layer 106. Ultimately, the anchor opening 132 and portion 134 reduce the incidence and degree of delamination of the frame layer 106 from the device substrate 102 around the perimeter of the packaged chip. Finally, it is noted that the use of the piezoelectric layer 104 to form third and fourth portions 136, 138 is merely illustrative. More generally, a layer (not shown) of another material of the apparatus (e.g., another layer of the first and/or second acoustic resonators 118, 120), or a dedicated layer (not shown) may be provided to form these portions.

Electrical connections to the various components of the apparatus (e.g., signal and ground connections to the first and second acoustic resonators 118, 120) are made via an input/output via 140 with a connection pad 142 disposed over an upper surface 144 of the lid layer 108.

Figure 2:
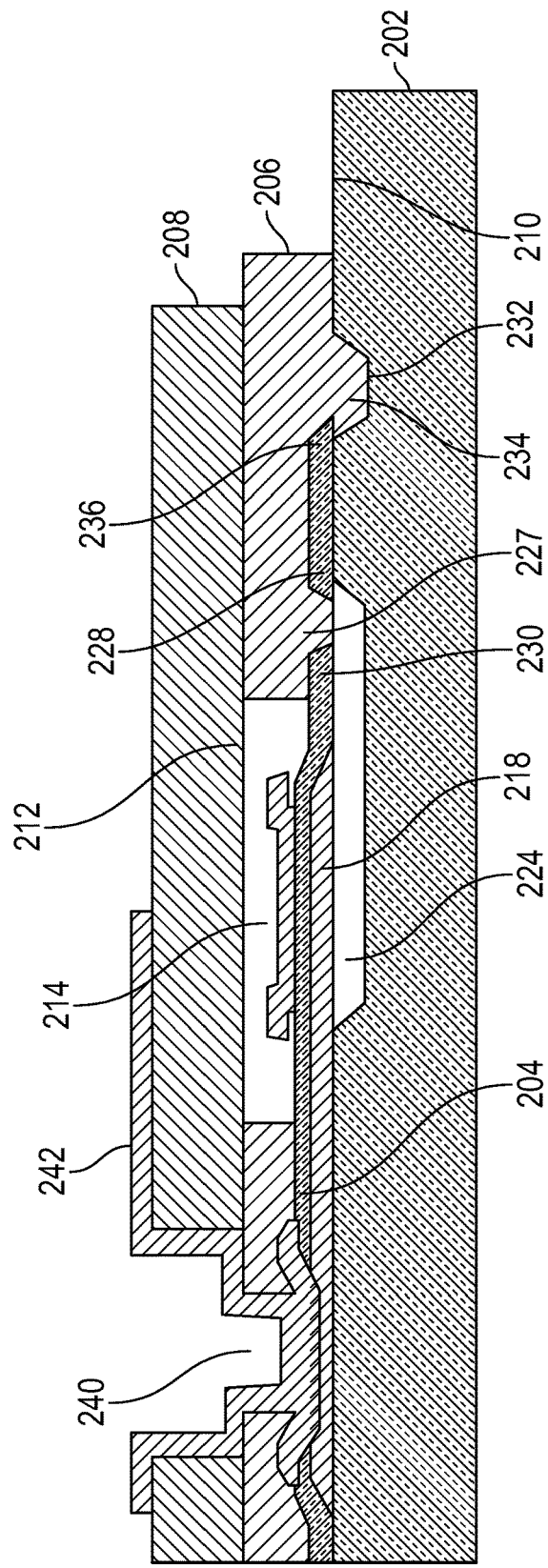
FIG. 2 is a cross-sectional view of an apparatus according to another representative embodiment.

FIG. 2 is a cross-sectional view of an apparatus 200 in accordance with a representative embodiment. Many aspects and details of the various components of the apparatus 200 are common to those described above in connection with representative embodiments of FIG. 1. These common aspects and details are not necessarily repeated, but are nonetheless contemplated by the description of the apparatus 200. Like apparatus 100, the apparatus 200 may also be a component of a wafer-level package.

The apparatus 200 comprises a device substrate 202, and a piezoelectric layer 204 disposed thereover. A frame layer 206 is disposed over an upper surface 210 of the device substrate 202, and comprises a photo-definable polymer material, the use and benefits thereof being described more fully below.

A lid layer 208 is disposed over an upper surface 212 of the frame layer 206, and generally comprises the same material as the frame layer 206. As described more fully below, the frame layer 206 and the lid layer 208 are separate layers when applied during fabrication of the apparatus. However, after processing the apparatus, such as during curing, the interface between the frame layer 206 and the lid layer 208 may be difficult, if not impossible to discern. As such, when the frame layer 206 and the lid layer 208 are initially separate layers, in the finished apparatus, these two layers are essentially one layer.

A compartment 214 is formed in the frame layer 206, and the lid layer 208 provides a cover for compartment 214. It is noted that the inclusion of a compartment in the apparatus 200 is merely illustrative, and more compartments, covered by the lid layer 208, are contemplated. Beneficially, the compartment 214, which is formed by frame layer 206 and lid layer 208, is substantially hermetically sealed, thereby preventing an appreciable degree of contaminants from entering the compartment 214. Generally, the compartment 214 provides sufficient hermeticity to prevent subsequently deposited mold compound (not shown) from entering the compartment 214. The frame layer 206 and lid layer 208, which provide the compartment 214, may also provide a degree of hermeticity to moisture, such as to meet a Joint Electron Device Engineering Council (JEDEC) specification requirement.

An acoustic resonator 218 is disposed over an upper surface 210 of the device substrate 202. In the present representative embodiment, the acoustic resonator 218 is disposed over an air cavity 224 in the device substrate 202. As will appreciated by one of ordinary skill in the art, the acoustic resonator 218 is a film bulk acoustic wave resonator (FBAR), which has an active area comprised of the contacting overlap of a first electrode, piezoelectric layer 204, and a second electrode, disposed over the air cavity 224. Alternatively, rather than an air cavity 224, the acoustic resonator 218 may be disposed over a structure of alternating low acoustic impedance and high acoustic impedance layers (not shown) for acoustic isolation. This structure of alternating low and high acoustic impedance layers is often referred to as a Bragg mirror.

A release opening 227 is provided in the device substrate 202 as shown. As is known, the release opening is provided adjacent to the air cavity 224, and enables the selective removal of sacrificial material (not shown) disposed in the air cavity 224. As noted above, the release opening 227 is provided only in embodiments that include an FBAR device. Accordingly, in embodiments in which the acoustic resonator 218 is an SMR devices, or a SAW device, or other electronic device not requiring a cavity therebelow, no release opening is provided, and no adhesion from filling such a release opening is realized.

In a representative embodiment, a first portion 228 of the piezoelectric layer 204 overhangs an edge of the air cavity 224, and a second portion 230 of the piezoelectric layer 204, which opposes the first portion 228, overhangs the air cavity 224. In the presently described embodiment, the first and second portions 228, 230 of the piezoelectric layer 204 provide the release opening 227. As described more fully below, in a representative embodiment, a portion of the frame layer 206 is disposed in the release opening 227, but does not extend into the air cavity 224. It is noted that according to a representative embodiment, the release opening 227 is an opening (i.e., a hole) in the piezoelectric layer 204, and in such an embodiment, the first and second portions 228, 230 are merely opposing sides of the hole that is the release opening 227. Alternative geometric arrangements are contemplated for the release opening 227, and dictate the shape of the first and second portions 228, 130.

Beneficially, providing this material in the release opening 227 increases the contacting surface area between the upper surface of the device substrate 202 and the lower surface of the frame layer 206. This increase in surface area improves adherence of the frame layer 206 to the device substrate 202, and results in a more robust apparatus 200. Finally, it is noted that the use of the piezoelectric layer 204 to form the release opening 227 is merely illustrative. More generally a layer (not shown) of another material of the apparatus (e.g., another layer of the acoustic resonator 218), or a dedicated layer (not shown) may be provided.

An anchor opening 232 is provided in the device substrate 202. Generally, and as described more fully below, the anchor opening 232 is disposed to circumscribe the various components (e.g., acoustic resonator 218) of a chip that is packaged for singulation. Accordingly, the apparatus 200 may be a component of a wafer-level package of a filter, or a multiplexer, or other similar single-chip components.

The anchor opening 232 has a portion 234 of the frame layer 206 disposed therein. In a representative embodiment, a third portion 236 (sometimes referred to as the first portion) of the piezoelectric layer 204 overhangs an edge of the anchor opening 232.

Beneficially, portion 234 of the frame layer 206 increases the surface area of contact between the upper surface of the device substrate 202 and the lower surface of the frame layer 206. This increase in surface area improves adherence of the frame layer 206 to the device substrate 202, and results in a more robust apparatus 200. Furthermore, the overhang of the third portion 236 of the piezoelectric layer 204 on top of the portion 234 of the frame layer 206 in the anchor opening 232 reinforces the adhesion of the device substrate 202 to the frame layer 206. Ultimately, the anchor opening 232 and portion 234 reduce the incidence and degree of delamination of the frame layer 206 from the device substrate 202 around the perimeter of the packaged chip. Finally, it is noted that the use of the piezoelectric layer 204 to form third portion 236 is merely illustrative. More generally, a layer (not shown) of another material of the apparatus (e.g., another layer of the acoustic resonator 218), or a dedicated layer (not shown) may be provided for this portion.

Electrical connections to the various components of the apparatus (e.g., signal and ground connections to the acoustic resonator 218) are made via an input/output via 240 with a connection pad 242 disposed over an upper surface 144 of the lid layer 208.

Figure 3:
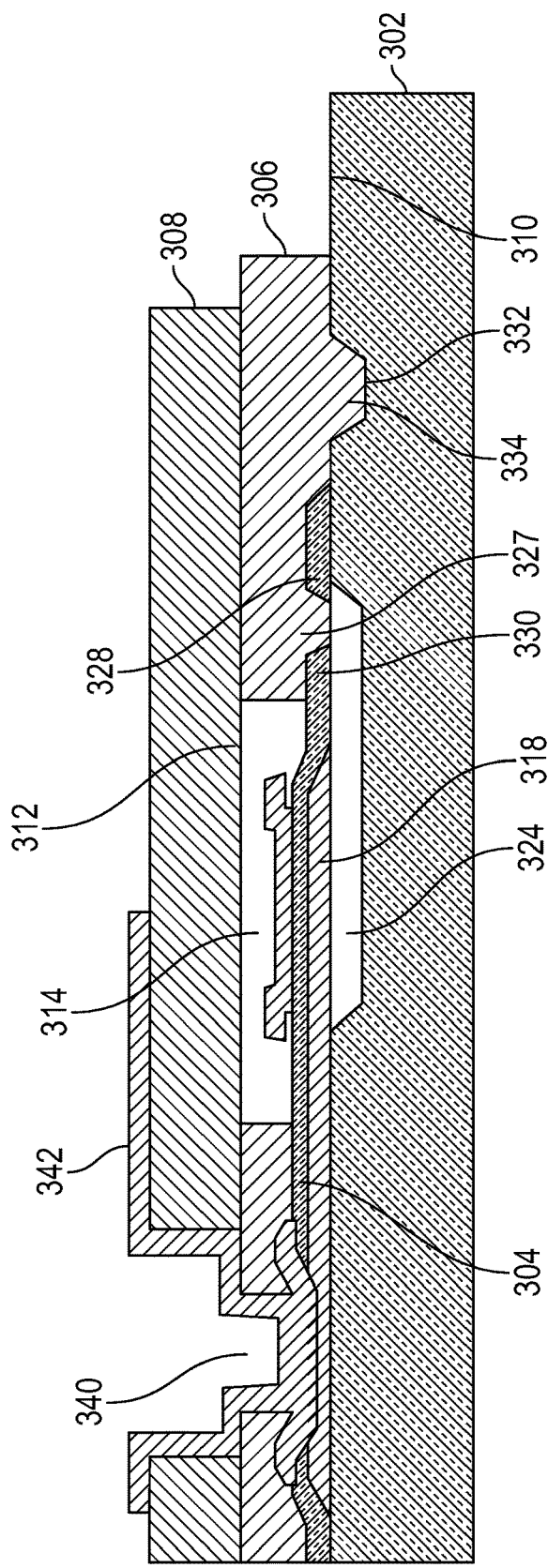
FIG. 3 is a cross-sectional view of an apparatus according to another representative embodiment.

FIG. 3 is a cross-sectional view of an apparatus 300 in accordance with a representative embodiment. Many aspects and details of the various components of the apparatus 300 are common to those described above in connection with representative embodiments of FIGS. 1 and 2. These common aspects and details are not necessarily repeated, but are nonetheless contemplated by the description of the apparatus 300. Like apparatuses 100, 200, the apparatus 300 may also be a component of a wafer-level package.

The apparatus 300 comprises a device substrate 302, and a piezoelectric layer 304 disposed thereover. A frame layer 306 is disposed over an upper surface 310 of the device substrate 302, and comprises a photo-definable polymer material, the use and benefits thereof being described more fully below.

A lid layer 308 is disposed over an upper surface 312 of the frame layer 306, and generally comprises the same material as the frame layer 306. As described more fully below, the frame layer 306 and the lid layer 308 are separate layers when applied during fabrication of the apparatus. However, after processing the apparatus, such as during curing, the interface between the frame layer 306 and the lid layer 308 may be difficult, if not impossible to discern. As such, when the frame layer 306 and the lid layer 308 are initially separate layers, in the finished apparatus, these two layers are essentially one layer.

A compartment 314 is formed in the frame layer 306, and the lid layer 308 provides a cover for compartment 314. It is noted that the inclusion of a single compartment in the apparatus 300 is merely illustrative, and more compartments, covered by the lid layer 308, are contemplated. Beneficially, the compartment 314, which is formed by frame layer 306 and lid layer 308, is substantially hermetically sealed, thereby preventing an appreciable degree of contaminants from entering the compartment 314. Generally, the compartment 314 provides sufficient hermeticity to prevent subsequently deposited mold compound (not shown) from entering the compartment 314. The compartment 314 may also provide a degree of hermeticity to moisture, such as to meet a Joint Electron Device Engineering Council (JEDEC) specification requirement.

An acoustic resonator 318 is disposed over an upper surface 310 of the device substrate 302. In the present representative embodiment, the acoustic resonator 318 is disposed over an air cavity 324 in the device substrate 302. As will appreciated by one of ordinary skill in the art, the acoustic resonator 318 is a film bulk acoustic wave resonator (FBAR), which has an active area comprised of the contacting overlap of a first electrode, piezoelectric layer 304, and a second electrode, disposed over the air cavity 324. Alternatively, rather than an air cavity 324, the acoustic resonator 318 may be disposed over a structure of alternating low acoustic impedance and high acoustic impedance layers (not shown) for acoustic isolation. This structure of alternating low and high acoustic impedance layers is often referred to as a Bragg mirror.

A release opening 327 is provided in the device substrate 302 as shown. As is known, the release opening is provided adjacent to the air cavity 324, and enables the selective removal of sacrificial material (not shown) disposed in the air cavity 324. As noted above, the release opening 327 is provided only in embodiments that include an FBAR device. Accordingly, in embodiments in which the acoustic resonators 318 is an SMR device, or a SAW device, or other electronic device not requiring a cavity therebelow, no release opening is provided, and no adhesion from filling such a release opening is realized.

In a representative embodiment, a first portion 328 of the piezoelectric layer 304 overhangs an edge of the air cavity 324, and a second portion 330 of the piezoelectric layer 304, which opposes the first portion 328, overhangs the air cavity 324. In the presently described embodiment, the first and second portions 328, 330 of the piezoelectric layer 304 provide the release opening 327. As described more fully below, in a representative embodiment, a portion of the frame layer 306 is disposed in the release opening 327, but does not extend into the air cavity 324. It is noted that according to a representative embodiment, the release opening 327 is an opening (i.e., a hole) in the piezoelectric layer 104, and in such an embodiment, the first and second portions 328, 330 are merely opposing sides of the hole that is the release opening 327. Alternative geometric arrangements are contemplated for the release opening 327, and dictate the shape of the first and second portions 328, 330.

Beneficially, providing this material in the release opening increases the contacting surface area between the upper surface of the device substrate 302 and the lower surface of the frame layer 306. This increase in surface area improves adherence of the frame layer 306 to the device substrate 302, and results in a more robust apparatus 300. Finally, it is noted that the use of the piezoelectric layer 304 to form the release opening 327 is merely illustrative. More generally a layer (not shown) of another material of the apparatus (e.g., another layer of the acoustic resonator 318), or a dedicated layer (not shown) may be provided.

An anchor opening 332 is provided in the device substrate 302. Generally, and as described more fully below, the anchor opening 332 is disposed to circumscribe the various components (e.g., acoustic resonator 318) of a chip that is packaged for singulation. Accordingly, the apparatus 300 may be a component of a wafer-level package of a filter, or a multiplexer, or other similar single-chip components.

The anchor opening 332 has a portion 334 of the frame layer 306 disposed therein. Beneficially, portion 334 of the frame layer 306 increases the surface area of contact between the upper surface of the device substrate 302 and the lower surface of the frame layer 306. This increase in surface area improves adherence of the frame layer 306 to the device substrate 302, and results in a more robust apparatus 300.

Electrical connections to the various components of the apparatus (e.g., signal and ground connections to the acoustic resonator 318) are made with an input/output via 340 with a connection pad 342 disposed over an upper surface 344 of the lid layer 308.

Figure 4:
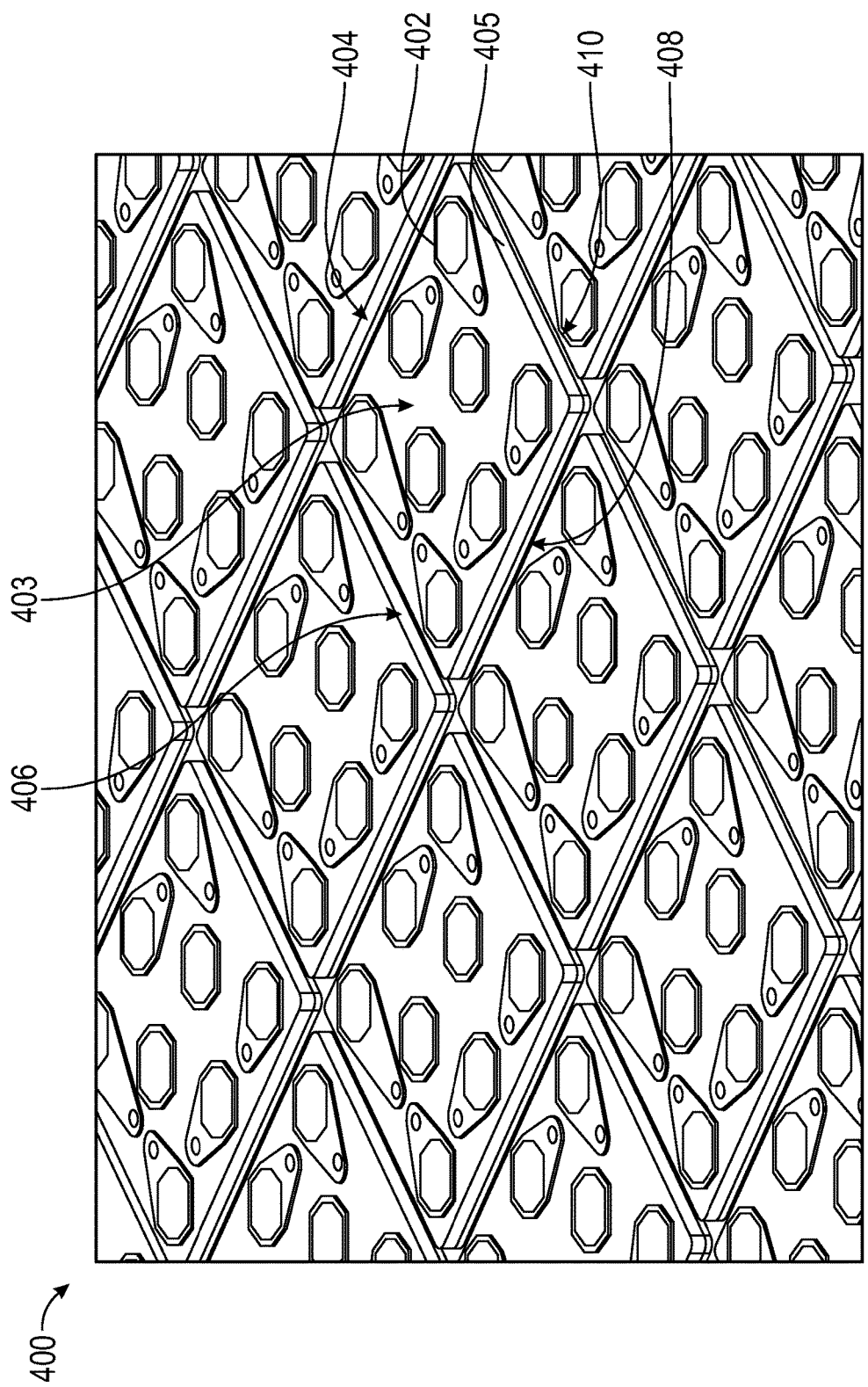
FIG. 4 is a perspective view of a packaged apparatus prior to dicing, according to a representative embodiment.

FIG. 4 is a perspective view of a portion of a packaged wafer 400 prior to dicing, according to a representative embodiment. Many aspects and details of the various components of the packaged wafer 400 are common to those described above in connection with representative embodiments of FIGS. 1-3. These common aspects and details are not necessarily repeated, but are nonetheless contemplated by the description of the packaged wafer 400.

As shown in FIG. 4, the packaged wafer 400 comprises a chip 402 having an upper surface 403. Notably, the upper surface 403 is the upper surface of a lid layer, such as lid layers 108, 208, 308 discussed above. As can be appreciated, the packaged wafer 400 is a wafer level package comprising a plurality of chips to be singulated.

The chip 402 comprises a plurality of components such as the acoustic resonators described above, packaged according methods of the present teachings as described more fully below. To this end, each chip of the packaged wafer 400 may be a stand-alone device such as an electrical filter in a multiplexer, such as a duplexer, for example, connected between an antenna (or multiple antennas as in the case of multiple input, multiple output (MIMO) designs) and a transceiver for filtering received and transmitted signals, typically within a predetermined radio frequency band. Other types of multiplexers in which the filters provided in the chips of the packaged wafer 400 may be included are diplexers, triplexers, quadplexers, quintplexers and the like, for example.

Chip 402 is bordered on its sides by a first scribe line 404, a second scribe line 406, a third scribe line 408, and a fourth scribe line 410. Dicing of the chip 402 and its removal of the chip from the remainder of the wafer is effected by sawing along the first scribe line 404, the second scribe line 320, the third scribe line 322, and the fourth scribe line 410. Once diced, the chip 402 can be flip-chip mounted on another structure (e.g., a PCB).

As noted above, the anchor openings and anchors, are disposed near the perimeter of the chips (e.g. chip 402), and as such closer to the first-fourth scribe lines 404, 406, 408 and 410. The additional adhesion provided between a frame layer 405 provides improved reliability to the chip by preventing delamination of the frame layer 405 from the device substrate (not shown in FIG. 4). Additionally, further adhesion can be provided using the portions that overhang the anchor and anchor opening as described above. Finally, the release openings, when filled with material from the lid layer, further improve the adhesion of the frame layer 405 to the device substrate.

Figure 5A:
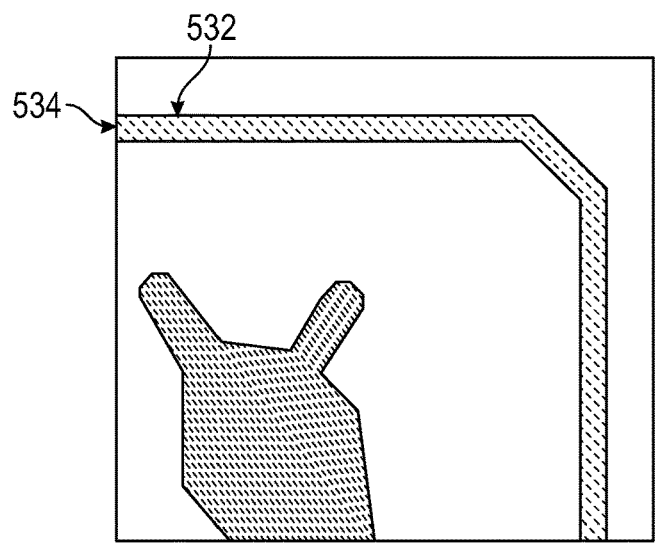
FIGS. 5A-5C are top views of anchor openings in accordance with representative embodiments.
Figure 5B:
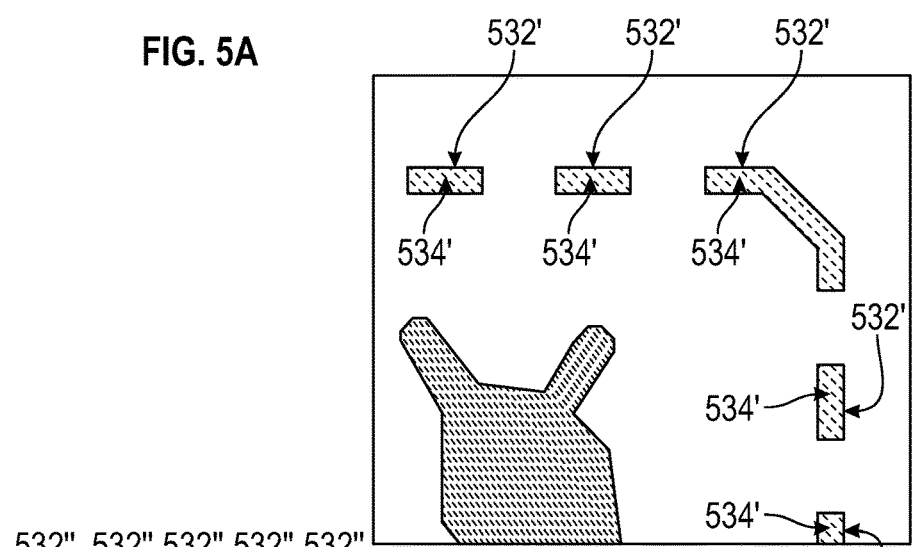
Figure 5C:
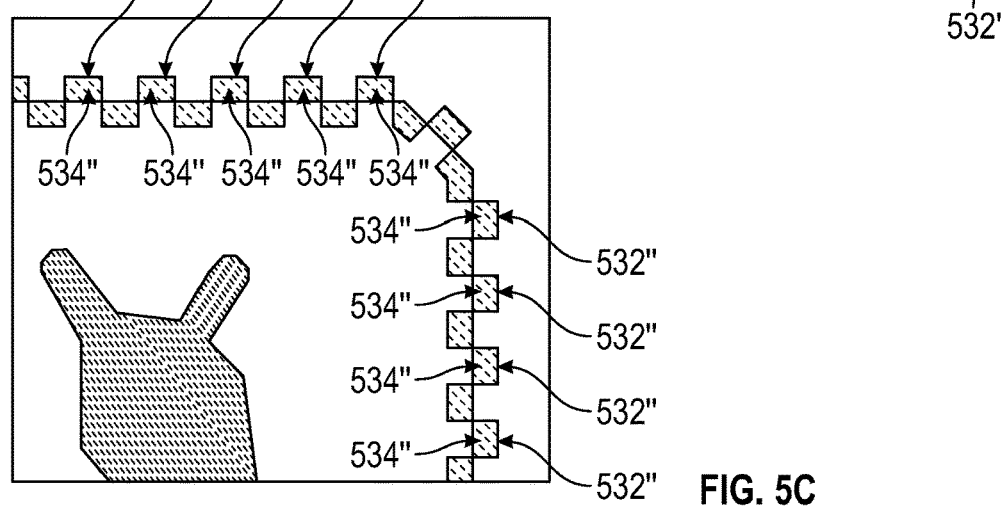

FIGS. 5A-5C are top views of anchor openings in accordance with representative embodiments. Many aspects and details of the various components of the anchor openings are common to those described above in connection with representative embodiments of FIGS. 1-4. These common aspects and details are not necessarily repeated, but are nonetheless contemplated by the description of the anchor openings.

Turning to FIG. 5A, a top view near a corner of a chip (e.g., chip 402) is depicted. An anchor opening 532 having an anchor 534 disposed therein is depicted in dashed lines because, of course, the anchor opening 532 is disposed beneath an upper surface 544 of a lid layer (not discernible in FIG. 5A) and frame layer (not discernable in FIG. 5A). It is noted that portions of the layer (e.g., piezoelectric layer— not shown in FIG. 5A) may overhang one or both edges of the anchor opening 532, such as described above in connection with FIGS. 2 and 3, respectively.

In the representative embodiment of FIG. 5A, the anchor opening 532 is disposed perimetrically around the chip, and near the edges of the chip. As will be appreciated from a review of FIGS. 4 and 5A, the edges of the chip result after the dicing/singulation process performed on a packaged wafer (e.g., packaged wafer 400) to provide a singulated chip. The anchor 534 disposed in the anchor opening 532 is thus disposed near the edge of the singulated chip, and is useful in preventing the delamination of the frame layer from the underlying device substrate (not shown in FIG. 5A).

Turning to FIG. 5B, a top view near a corner of a chip (e.g., chip 402) is depicted. An anchor opening 532' having an anchor 534' disposed therein is depicted in dashed lines because, of course, the anchor opening 532' is disposed beneath an upper surface 544' of a lid layer (not discernible in FIG. 5B) and frame layer (not discernable in FIG. 5B). It is noted that portions of the layer (e.g., piezoelectric layer— not shown in FIG. 5B) may overhang one or both edges of the anchor opening 532', such as described above in connection with FIGS. 2 and 3, respectively.

In the representative embodiment of FIG. 5B, the anchor opening 532' is disposed intermittantly perimetrically around the chip, and near the edges of the chip. As such, a plurality of anchor openings 532' are provided. These anchor openings 532' are not necessarily equal in length, or separation. For example, the length of the anchor opening 532' disposed at a corner of the chip is comparatively long to provide added robustness at the corner. As will be appreciated from a review of FIGS. 4 and 5B, the edges of the chip result after the dicing/singulation process performed on a packaged wafer (e.g., packaged wafer 400) to provide a singulated chip. The anchor 534' disposed in the anchor openings 532' is thus disposed near the edge of the singulated chip, and is useful in preventing the delamination of the frame layer from the underlying device substrate (not shown in FIG. 5B).

Turning to FIG. 5C, a top view near a corner of a chip (e.g., chip 402) is depicted. An anchor opening 532" having an anchor 534" disposed therein is depicted in dashed lines because, of course, the anchor opening 532" is disposed beneath an upper surface 544" of a lid layer (not discernible in FIG. 5C) and frame layer (not discernable in FIG. 5C). It is noted that portions of the layer (e.g., piezoelectric layer— not shown in FIG. 5B) may overhang one or both edges of the anchor opening 532", such as described above in connection with FIGS. 2 and 3, respectively.

In the representative embodiment of FIG. 5C, the anchor opening 532" is disposed in an alternating pattern perimetrically around the chip, and near the edges of the chip. As such, a plurality of anchor openings 532" are provided. These anchor openings 532" are on opposing sides of a medial line, and may be of substantially the same area, or may have differing areas. As will be appreciated from a review of FIGS. 4 and 5C, the edges of the chip result after the dicing/singulation process performed on a packaged wafer (e.g., packaged wafer 400) to provide a singulated chip. The anchor 534" disposed in the anchor openings 532" is thus disposed near the edge of the singulated chip, and is useful in preventing the delamination of the frame layer from the underlying device substrate (not shown in FIG. 5C).

FIGS. 6A-6J are cross-sectional views of a process for fabricating an apparatus 600 according to a representative embodiment. Many aspects and details of the various components of the apparatus 600 are common to those described above in connection with representative embodiments of FIGS. 1-5. These common aspects and details are not necessarily repeated, but are nonetheless contemplated by the description of the apparatus 600. Like apparatuses 100, 200, 300, and 500, the apparatus 600 may also be a component of a wafer-level package.

Turning initially to FIG. 6A, a device substrate 602 is shown, and has a piezoelectric layer 604 disposed thereover. A first acoustic resonator 618 and a second acoustic resonator 620 are disposed over an upper surface 610 of the device substrate 602. In the present representative embodiment, the first acoustic resonator 618 is disposed over a first air cavity 624 in the device substrate 602, and the second acoustic resonator 620 is disposed over a second air cavity 626 in the device substrate 602. As will appreciated by one of ordinary skill in the art, the first and second acoustic resonators 618, 620 are film bulk acoustic wave resonators (FBARs) each having an active area comprised of the contacting overlap of a first electrode, piezoelectric layer 604, and a second electrode, disposed over respective first and second air cavities 624, 626. Alternatively, rather than air cavities, the first and second acoustic resonators 618, 620 may be disposed over a structure of alternating low acoustic impedance and high acoustic impedance layers (not shown) for acoustic isolation. This structure of alternating low and high acoustic impedance layers is often referred to as a Bragg mirror.

An anchor opening 632 is provided in the device substrate 602. Generally, and as described more fully below, the anchor opening 632 is disposed to circumscribe the various components (e.g., first and second acoustic resonators 618, 620) of a chip that is packaged for singulation. Accordingly, the apparatus 600 (see FIG. 6J) may be a component of a wafer-level package of a filter, or a multiplexer, or other similar single-chip components.

The fabrication of the various devices and features depicted in connection with the representative embodiment may be effected by a variety of known methods and material, such as described in the above-incorporated patent documents. Notably, while the anchor opening 632 is new and thus not known, it can be fabricated using a known wet etch, or a dry-etching method using a reactive ion or plasma etch. Depending on the aspect ratio desired, the anchor opening 632 may be fabricated by using a suitable technique, such as the Bosch method.

In a representative embodiment, a first portion 628 of the piezoelectric layer 604 overhangs an edge of the first air cavity 624, and a second portion 630 of the piezoelectric layer 604, which opposes the first portion 628, overhangs the first air cavity 624. In the presently described embodiment, the first and second portions 628, 630 of the piezoelectric layer 104 provide a release opening 627. As described more fully below, in a representative embodiment, a portion of the frame layer 606 is disposed in the release opening 627, but does not extend into the second air cavity 626. As noted above, the release opening 627 is provided only in embodiments that include an FBAR device. Accordingly, in embodiments in which the first and second acoustic resonators 618, 620 are SMR devices, or SAW devices, or other electronic devices, no release opening is provided, and no adhesion from filling such a release opening is realized. It is further noted that according to a representative embodiment, the release opening 627 is an opening (i.e., a hole) in the piezoelectric layer 604, and in such an embodiment the first and second portions 628, 630 are merely opposing sides of the hole that is the release opening 627. Alternative geometric arrangements are contemplated for the release opening 627, and dictate the shape of the first and second portions 628, 630.

In a representative embodiment, a third portion 636 (sometimes referred to as the first portion) of the piezoelectric layer 104 overhangs an edge of the anchor opening 632, and a fourth portion 638 (sometimes referred to as the second portion) of the piezoelectric layer 604, opposing the first portion of the layer, overhangs the anchor opening 632.

Turning to FIG. 6B, a frame layer 606 is disposed over an upper surface 610 of the device substrate 602, and comprises a photo-definable polymer material, the use and benefits thereof being described more fully below. As will be appreciated as the present description continues, the frame layer 606 illustratively comprises a negative tone photosensitive material (polymer) that crosslinks and hardens when exposed to UV radiation. In accordance with a representative embodiment, the frame layer 606 has a thickness in the range of approximately 10.0 µm to approximately 50.0 µm.

Illustratively, the frame layer 606 is deposited in a dry film resist (DFR) format, and may be suspended or partially suspended over substrate topography right after lamination process. Just by way of example, suspended areas may provided over release-holes (e.g., release opening 627) and anchor release-holes (e.g., anchor release-hole 637).

Figure 6C:
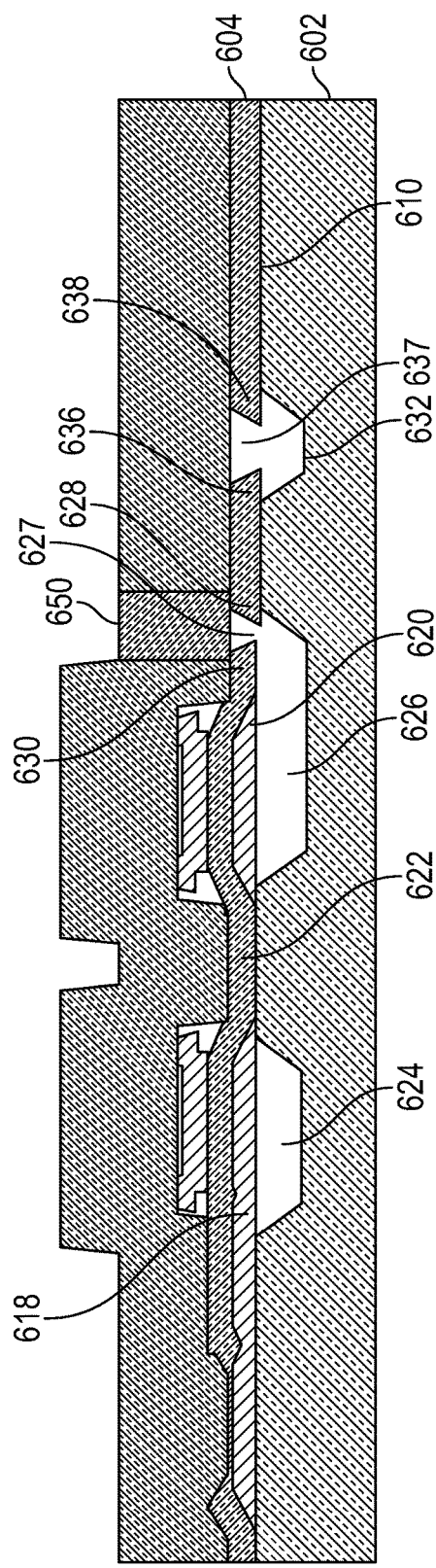

Turning to FIG. 6C, in a first photolithography step, a mask (not shown) is disposed over regions of the frame layer 606 to be protected, and a first exposure is effected. In this step only the portion 650 of the frame layer 606 is exposed over the release-holes (e.g., release opening 627). With exposure over the release-holes, the polymer crosslinks and hardens over the release-holes. Because the portion 650 is cross-linked, reflow of the polymer of frame layer 606 into the release-holes occurs during subsequent baking. Notably, baking of polymer is necessary to ensure that polymer becomes conformal with the underlying layers (e.g., the piezoelectric layer 604 and the device substrate 602) to avoid any void formations (due to polymer suspending over certain parts of the substrate topography)

Figure 6D:
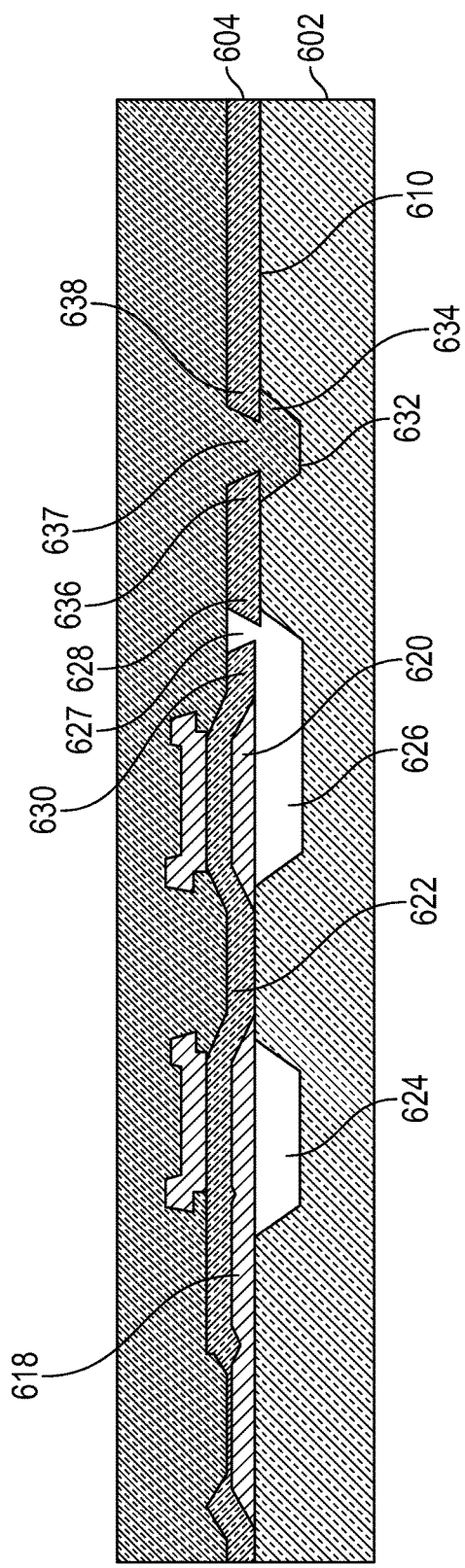

Turning to FIG. 6D, a first post exposure bake sequence (PEB1) is carried out. In an illustrative embodiment, the PEB1 is carried out at a temperature in the range of approximately 70° C. to approximately 150° C., for approximately 30 seconds to approximately 10 minutes. PEB1 may need optimization within or outside illustrative temperature and time range to obtain the necessary amount of polymer flow (which may vary with different polymer DFR products).

During PEB1, the portion of frame layer 606 that was not exposed to UV radiation (i.e., protected in FIG. 6C with a mask (not shown)), softens and flows to fill the gaps in the suspended parts of the substrate topography, including the anchor opening 632. Most notably, the first and second acoustic resonators 618, 620 are substantially encased in the polymer material of the frame layer 606, and the anchor opening 632 is filled to form the anchor 634. However, because the portion 650 of the frame layer 606 is cross-linked, the polymer material of the frame layer does not appreciably flow into the release opening 627.

Figure 6E:
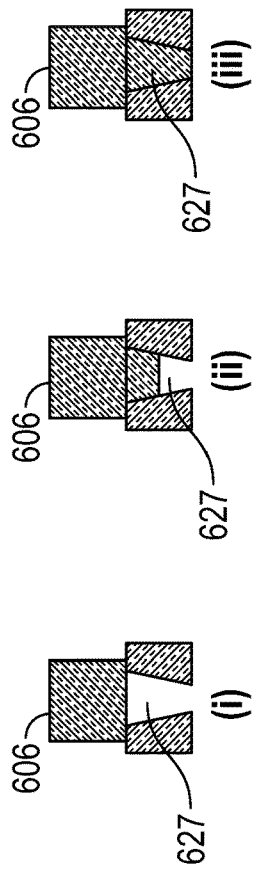

FIGS. 6E i-iii depict variations of the process that will allow polymer to flow into the release opening 627, but not into the second air cavity 626. To this end, this flow can be effected by forgoing the first exposure step described above, and thereby not cross-linking the portion of the frame layer 606 above the release opening 627, and controlling the time and temperature of a baking sequence to fill the release opening 627 and the anchor opening 632. Alternatively during PEB 1, especially when using temperatures near the higher end of the range, crosslinked polymer may partially fill release opening 627 with a portion of the frame layer 606 as shown in FIG. 6Eii; or may completely fill release opening 627 as shown in FIG. 6Eiii.

Figure 6F:
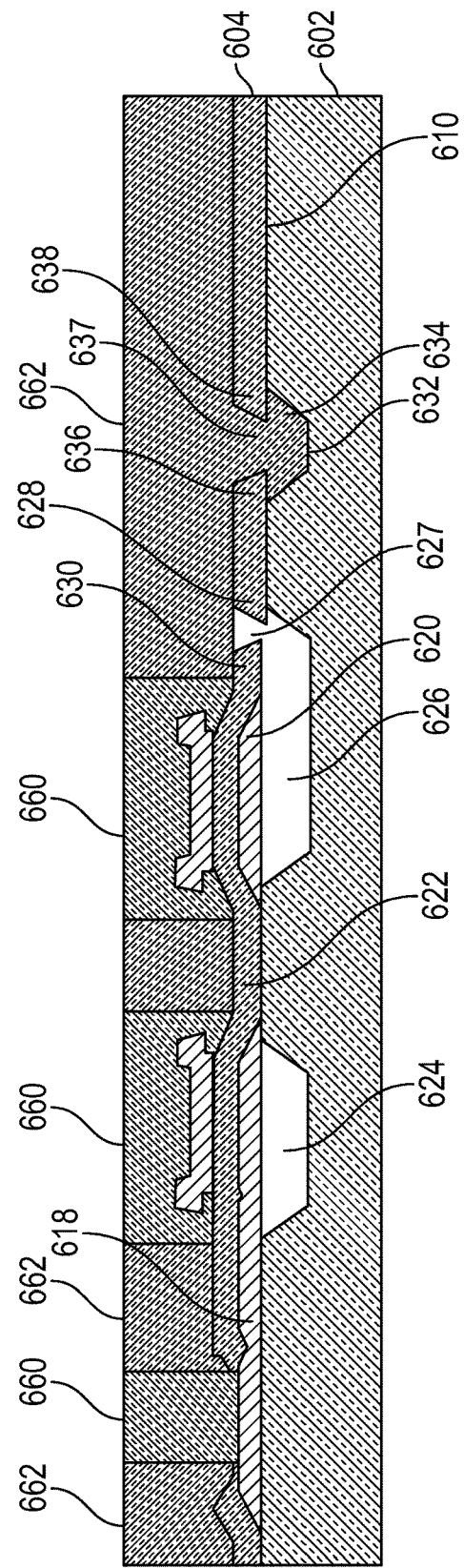

Turning to FIG. 6F, in a second photolithography step, a mask (not shown) is disposed over regions 660, and not over regions 662. A second exposure to UV radiation is carried out, and the regions 662 of frame layer 606 are developed, and cross-link. This step hardens the final desired pattern in the frame layer 606, and defines compartments for the first and second acoustic resonators 618, 620. To this end, the regions 660 are protected during the second exposure, and are not cross-linked, so, after developing to remove the portion of the frame layer 606 in regions, the compartments are defined by the regions 660 which have hardened and remain after exposure.

Figure 6G:
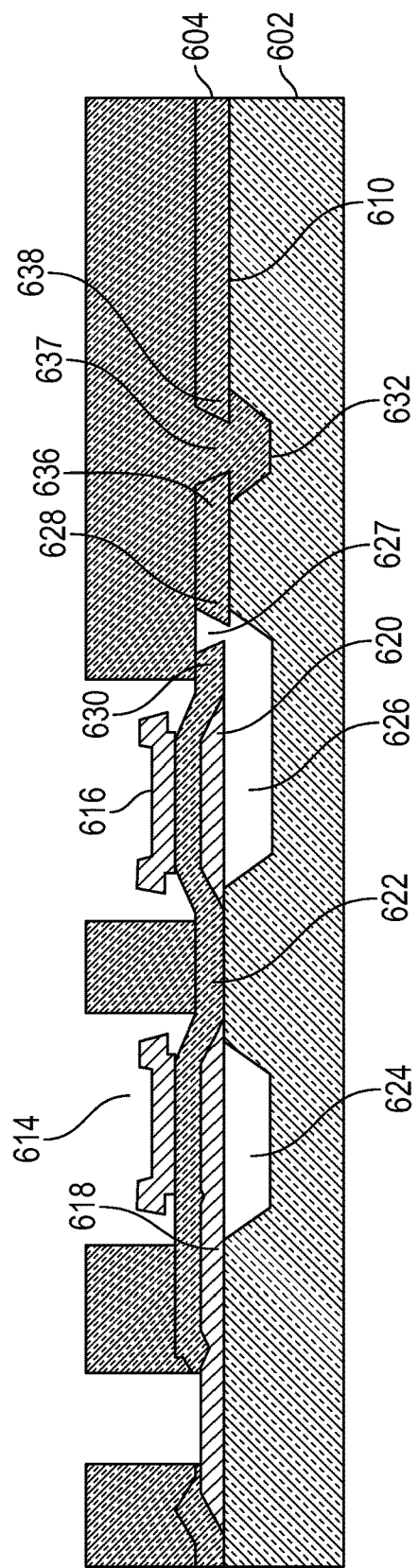

Turning to FIG. 6G, a second post exposure bake (PEB2) is carried out, the photo-polymer material of the frame layer 606 is developed, and first and second compartments 614, 616, and via 664 are revealed.

Turning to FIG. 6H, a lid layer 608 is disposed over the upper surface 612 of the frame layer 606, and generally comprises the same material as the frame layer 606. In accordance with a representative embodiment, the frame layer 606 has a thickness in the range of approximately 10.0 µm to approximately 50.0 µm.

The lid layer 608 is exposed and developed to reveal the I/O cavity 640, and to cross-link the lid layer 608, thereby hardening the lid layer 608.

Turning to FIG. 6I, the lid layer 608 is exposed and developed to reveal the I/O via 640.

Finally, a third heating (bake) step is carried out to cure the lid layer 608 and the frame layer 606 to achieve targeted structural properties. During this baking sequence, as noted above, if the same material is used to define the frame layer 606 and the lid layer 608, these layers can fuse together, and their interface may be undiscernable.

Figure 6J:
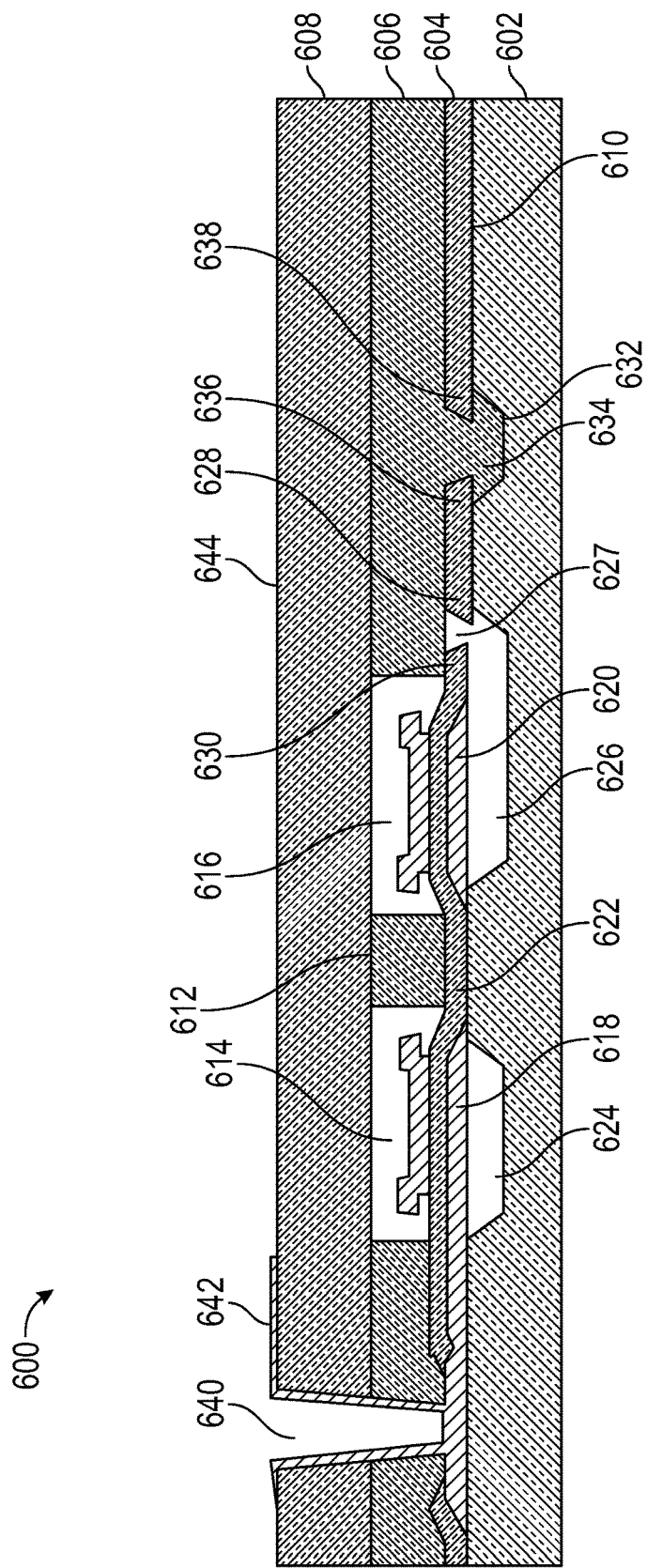

Turning to FIG. 6J, apparatus 600 is completed after metallization to provide the I/O cavity 640 and the contact pad 642. Notably, the apparatus 600 is substantively the same as apparatus 100, except the release opening 627 is filled with material 639 from the frame layer 606 in a manner described above in connection with FIG. 6E.

FIG. 7 shows a simplified schematic block diagram of an electrical filter 700 in accordance with a representative embodiment. The electrical filter 700 comprises series acoustic resonators 701 and shunt acoustic resonators 702. The series acoustic resonators 701 and shunt acoustic resonators 702 may each comprise first and second acoustic resonators 118, 120 (or acoustic resonators 218, 318, 618, 620) described in connection with the representative embodiments of FIGS. 1-6J. As can be appreciated, the electrical filter 700 may be provided over a common substrate and in package form (such as chip 402). The electrical filter 700 is commonly referred to as a ladder filter, and may be used, for example, in duplexer applications. It is emphasized that the topology of the electrical filter 700 is merely illustrative and other topologies are contemplated. Moreover, the acoustic resonators of the representative embodiments are contemplated in a variety of applications including, but not limited to duplexers.

The preceding description of the disclosed embodiments is provided to enable any person skilled in the art to make or use the present disclosure. As such, the above disclosed subject matter is to be considered illustrative, and not restrictive, and the appended claims are intended to cover all such modifications, enhancements, and other embodiments which fall within the true spirit and scope of the present disclosure. Thus, to the maximum extent allowed by law, the scope of the present disclosure is to be determined by the broadest permissible interpretation of the following claims and their equivalents, and shall not be restricted or limited by the foregoing detailed description.

I claim:

1. An apparatus, comprising:
   a device substrate having an upper surface, wherein an anchor opening exists in the device substrate;
   a frame layer having an upper surface;
   a lid layer disposed over the upper surface of the frame layer, wherein the lid layer and the frame layer each comprise a photodefinable polymer material;
   a compartment in the frame layer, wherein the lid layer provides a cover for the compartment, and a portion of the frame layer is disposed in the anchor opening; and
   an acoustic wave resonator.

2. The apparatus of claim 1, wherein an air cavity exists in the device substrate beneath the compartment, and the acoustic wave resonator comprises a film bulk acoustic wave resonator (FBAR) disposed over the upper surface of the device substrate and in the compartment, and extends over the air cavity.

3. The apparatus of claim 2, wherein a release opening exists over a portion of the air cavity.

4. The apparatus of claim 3, wherein a portion of the frame layer is disposed in the release opening.

5. The apparatus of claim 2, wherein a release opening exists in a layer disposed over the upper surface of the device substrate, and a first portion of a piezoelectric layer of the FBAR overhangs an edge of the air cavity.

6. The apparatus of claim 5, wherein a second portion of the layer, opposing the first portion of the layer, overhangs the air cavity, and with the first portion provides the release opening.

7. The apparatus of claim 5, wherein a portion of the frame layer is disposed in the release opening.

8. The apparatus of claim 6, wherein a portion of the frame layer is disposed in the release opening.

9. The apparatus of claim 5, wherein the layer is a piezoelectric layer, and a third portion of the piezoelectric layer is a component of an active area of the FBAR.

10. The apparatus of claim 1, wherein a piezoelectric layer is disposed over the upper surface of the device substrate, and a first portion of the piezoelectric layer overhangs an edge of the anchor opening.

11. The apparatus of claim 10, wherein a second portion of the piezoelectric layer, opposing the first portion of the piezoelectric layer, overhangs the anchor opening.

12. An electrical filter, comprising:
   a device substrate having an upper surface, wherein an anchor opening exists in the device substrate;
   a frame layer having an upper surface;
   a lid layer disposed over the upper surface of the frame layer, wherein the lid layer and the frame layer each comprise a photodefinable polymer material;
   a compartment in the frame layer, wherein the lid layer provides a cover for the compartment, and a portion of the frame layer is disposed in the anchor opening; and
   an acoustic resonator disposed in the compartment in the frame layer, and above the upper surface of the device substrate.

13. The electrical filter of claim 12, wherein a release opening exists over a portion of an air cavity.

14. The electrical filter of claim 13, wherein a portion of the frame layer is disposed in the release opening.

15. The electrical filter of claim 14, wherein the release opening exists in a layer disposed over the upper surface of the device substrate, and a first portion of a piezoelectric layer overhangs an edge of the air cavity.

16. The electrical filter of claim 15, wherein a second portion of the piezoelectric layer, opposing the first portion of the piezoelectric layer, overhangs the air cavity, and with the first portion provides the release opening.

17. The electrical filter of claim 15, wherein a portion of the frame layer is disposed in the release opening.

18. The electrical filter of claim 17, wherein a portion of the frame layer is disposed in the release opening.

19. The electrical filter of claim 12, wherein an air cavity exists in the device substrate beneath the compartment, and the acoustic resonator is a film bulk acoustic wave resonator (FBAR) disposed over the upper surface of the device substrate and in the compartment, and extends over the air cavity.

20. The electrical filter of claim 12, wherein the acoustic resonator is a solid mount resonator (SMR) disposed over the upper surface of the device substrate and in the compartment.

21. The electrical filter of claim 12, wherein the acoustic resonator is a surface acoustic wave (SAW) resonator disposed over the upper surface of the device substrate and in the compartment.

\* \* \* \* \*